United States Patent

Gardner et al.

[11] Patent Number: 6,057,583
[45] Date of Patent: May 2, 2000

[54] TRANSISTOR WITH LOW RESISTANCE METAL SOURCE AND DRAIN VERTICALLY DISPLACED FROM THE CHANNEL

[75] Inventors: Mark I. Gardner, Cedar Creek; H. Jim Fulford, Jr., Austin, both of Tex.

[73] Assignee: Advanced Micro Devices, Inc., Sunnyvale, Calif.

[21] Appl. No.: 09/227,511

[22] Filed: Jan. 6, 1999

[51] Int. Cl.[7] .................................................. H01L 29/76
[52] U.S. Cl. ........................ 257/408; 257/330; 257/408; 257/751; 257/902
[58] Field of Search .................................. 257/330, 751, 257/902, 408

[56] References Cited

U.S. PATENT DOCUMENTS

| | | | |
|---|---|---|---|
| 3,716,469 | 2/1973 | Bhatt et al. ............................... | 257/330 |
| 4,243,997 | 1/1981 | Natori et al. .............................. | 257/330 |
| 4,453,305 | 6/1984 | Janes et al. ............................... | 257/330 |
| 4,513,303 | 4/1985 | Abbas et al. .............................. | 257/330 |
| 4,631,563 | 12/1986 | Iizuka ..................................... | 257/330 |
| 4,665,414 | 5/1987 | Koeneke et al. .......................... | 257/330 |
| 5,283,465 | 2/1994 | Yamazaki ................................. | 257/663 |
| 5,436,504 | 7/1995 | Chakravorty et al. .................... | 257/758 |
| 5,502,322 | 3/1996 | Jung et al. ................................ | 257/330 |
| 5,808,340 | 9/1998 | Wollesen et al. ......................... | 257/330 |
| 5,900,672 | 5/1999 | Chan et al. ............................... | 257/751 |

FOREIGN PATENT DOCUMENTS

| | | | |
|---|---|---|---|
| 357145376 | 9/1982 | Japan ...................................... | 257/902 |
| 361206252 | 9/1986 | Japan ...................................... | 257/902 |

OTHER PUBLICATIONS

Kimura et.al. "Short Effect Suppressed Sub 0.1 microns Grooved Gate MOSFET with W Gate", IEEE Transactions, Jan. 1995.

*Primary Examiner*—Mahshid Saadat
*Assistant Examiner*—Edgardo Orizt
*Attorney, Agent, or Firm*—Kevin L. Daffer; Conley, Rose & Tayon

[57] ABSTRACT

A transistor is provided and formed using self-aligned low-resistance source and drain regions within a metal-oxide semiconductor (MOS) process. The gate of the transistor may also be formed from a low-resistance material such as a metal. The source and drain regions of the transistor are configured upon a semiconductor substrate, and the transistor channel is within the substrate. A protective dielectric layer is deposited over the semiconductor substrate. Source/drain trenches are formed in the protective dielectric layer and subsequently filled with sacrificial dielectrics. The protective dielectric lying between these sacrificial dielectrics is removed, and replaced with sidewall spacers, a gate dielectric, and a gate conductor which may be formed from a low-resistance metal. The sacrificial dielectrics are subsequently removed and replaced with source/drain regions which are preferably formed from a low-resistance metal. The resulting transistor may exhibit low contact and series resistances, and increased operating speed.

16 Claims, 5 Drawing Sheets

TRANSISTOR WITH LOW RESISTANCE METAL SOURCE AND DRAIN VERTICALLY DISPLACED FROM THE CHANNEL

BACKGROUND OF THE INVENTION

1. Field of the Invention

This invention relates to integrated circuit fabrication, and more particularly, to a transistor having low-resistance metal source and drain structures which are vertically displaced from a channel, and to a method for producing this device.

2. Description of the Relevant Art

Advances in computer technology, among other factors, result in a continual demand for faster integrated circuits. Integrated circuit speed may be limited by various factors, such as circuit architecture, interconnection delays, and speed limitations of individual transistors. Such transistor speed limitations may often be described in terms of RC time constants, where R and C are resistance and capacitance, respectively, associated with the transistor structure. RC time constants characterize the time needed for a transistor to turn on or off, so that transistor speed may be increased by making RC time constants as low as possible. One type of resistance associated with a transistor structure is series resistance, or resistance encountered by carriers traveling within a given portion of the transistor, such as the source of a MOSFET. Contact resistance, the resistance associated with a contact to a transistor region, is another type.

Both series and contact resistance are associated with source, drain, and gate regions of MOS transistors. Series resistance is related to the resistivity of the doped silicon typically used for source, drain and gate regions, while contact resistance is related to the resistance of the junction formed between such a silicon source, drain or gate region and an interconnect, which is typically formed from metal. A partial cross-sectional view of a conventional MOSFET structure is shown in FIG. 1. Gate dielectric 12 and polysilicon gate conductor 14 are formed upon silicon substrate 10 by deposition and patterning of dielectric and polysilicon layers. Source 16 and drain 18 are of opposite carrier type than substrate 10. No patterning step is needed for introduction of source 16 and drain 18, since these impurity distributions are typically introduced after formation of gate conductor 14. Gate conductor 14 serves as a mask to exclude the dopants forming source 16 and drain 18 from the transistor channel underlying gate dielectric 12. Because photolithography and the associated alignment process is not used in forming source 16 and drain 18, the source and drain are said to be "self-aligned" to the gate. The transistor and the fabrication method used to form it are also often described as self-aligned.

Self-aligned source/drain regions such as regions 16 and 18 in FIG. 1 exhibit minimal overlap with the transistor gate, minimizing the parasitic capacitances that can increase RC time constants and limit high-frequency transistor performance. In addition, the self-alignment process allows smaller feature sizes to be used, because the size tolerances which must be left to allow for lithographic alignment error are not needed. The use of conventional self-aligned processes does impose limitations upon transistor fabrication, however. For example, the use of impurity regions in the semiconductor substrate to form the source and drain necessitates high-temperature (greater than about 900° C.) processing to activate impurities and anneal substrate damage, if the source and drain impurities are introduced by ion implantation (as is generally the case). Alternative impurity introduction methods such as diffusion also involve high-temperature processes. The choice of gate materials is therefore limited, because the gate must be able to withstand the high-temperature source/drain processing. In part for this reason, the current material of choice for gate conductors in MOSFET fabrication is polycrystalline silicon, or polysilicon. The resistivity of a polysilicon gate conductor is typically lowered by doping, which is often performed by ion implantation, using the same implants which dope the self-aligned source and drain.

Problems can arise with this doping, however, in part because of the different rates of dopant diffusion in polysilicon as opposed to single-crystal silicon. Although typical gate conductor thicknesses are greater than the depths of the shallow junctions required for source and drain regions in high-performance devices, diffusion rates along the grain boundaries of polycrystalline films can be on the order of one hundred times as fast as in single-crystal silicon. This can allow dopants in a polysilicon gate conductor to diffuse across the thin gate dielectric and into the underlying channel region during high-temperature processes such as implant anneals. Such diffusion can leave a region of low carrier concentration in the polysilicon directly above the gate dielectric, an occurrence often called the "polysilicon depletion effect". This region of the gate conductor adjacent to the gate dielectric therefore has a higher resistivity, and the resulting device performs as if it had an increased gate dielectric thickness. Effective doping of polysilicon gate regions is further complicated in CMOS devices because of differences in diffusion behavior of boron, the typical p-channel transistor dopant, and arsenic, the typical n-channel transistor dopant. Boron diffuses more rapidly in polysilicon than arsenic, which tends to segregate at grain boundaries. Adequate activation of arsenic impurities throughout the gate conductor of an n-channel device without causing excessive boron diffusion and polysilicon depletion effects in a p-channel device presents significant challenges.

A further challenge associated with conventional self-aligned transistor fabrication is the difficulty of forming source/drain junctions shallow enough that short-channel effects are minimized. As an example of a short-channel effect, for a given oxide thickness and substrate doping, threshold voltage $V_T$ tends to decrease as channel length decreases, for channel lengths smaller than about 2 microns. As used herein, a decrease in $V_T$ refers to a $V_T$ which becomes less positive or more negative in the case of an n-channel device, or a $V_T$ which becomes less negative or more positive in the case of a p-channel device. This decrease in $V_T$ occurs because the effect of the source and drain depletion regions on the charge controlled by the gate becomes increasingly important as channel length decreases. Depletion regions and an inversion layer for the MOSFET of FIG. 1, under biasing conditions such that the transistor is turned on, are shown in the transistor of FIG. 2. Before free charge in inversion region 70 is induced by a voltage applied to gate conductor 14, a depletion region 72 (having a boundary marked with a short-dashed line) is formed in substrate 10 below gate conductor 14. The threshold voltage $V_T$ which must be applied to gate 14 to turn on the transistor includes the voltage needed to establish depletion region 72 and that needed to induce the carriers in inversion region 70.

As shown in FIG. 2, parts of depletion region 72 are formed by drain depletion region 74 arising from the drain-to-substrate junction and source depletion region 76 arising from the source-to-substrate junction. Boundaries of source and drain depletion regions 76 and 74 are marked by long-dashed lines in FIG. 2. This leaves only the charge in shaded depletion region 78 to be induced by the gate voltage, which reduces the voltage needed to turn on the transistor as compared to that predicted using depletion region 72. For given doping levels and oxide thickness, $V_T$ decreases as the channel length decreases because the fraction of the depletion region under the channel which is contributed by the source and drain regions becomes larger with decreasing channel length. This reduction in threshold voltage is undesirable because it increases the subthreshold, or "off", current of the transistor.

A second short-channel effect related to encroachment of source/drain depletion regions into the vicinity of the channel is known as "punchthrough". Punchthrough refers to current flow between the source and drain by a path separate from that along the transistor channel. This current path is established by widening of the drain and source depletion regions under bias until the drain and source depletion regions merge, thereby creating a continuous electric field driving current through the merged depletion region. The punchthrough current path is deeper within the substrate than the intended transistor channel, typically at approximately the source/drain junction depth. Punchthrough is undesirable because punchthrough current is less directly controlled by the gate of the transistor, and may flow even when the transistor channel is turned off.

Both threshold voltage reduction and punchthrough may be alleviated by reducing the encroachment of the source/drain depletion regions into the vicinity of the channel. This depletion region encroachment may be reduced by decreasing the junction depths of the source and drain. The formation of shallow source and drain junctions is, however, rather difficult to accomplish in transistor devices which employ fast-diffusing species as the source/drain dopant. Due to their relatively high diffusivity, some dopant species, such as boron, can penetrate deeply into the substrate during processing subsequent to introduction. Also, advances in technology are required to make available low-energy ion implanters before low implant depths can be realized.

While reducing the junction depth provides protection against short-channel effects such as $V_T$ reduction and punchthrough, it also undesirably gives rise to increased resistance in the source and drain junctions. As the resistance in the source and drain junctions increases, the saturation drive current and the overall speed of the transistor may drop. Moreover, forming ohmic contacts to relatively shallow junctions has several drawbacks. A contact layer which consumes the underlying source and drain junctions is often used during contact formation. For example, a refractory metal may be deposited across the source and drain junctions and heated to promote a reaction between the metal and the silicon of the underlying substrate. As a result of the reaction, a low resistivity self-aligned silicide (i.e., salicide) may form upon the junctions. The silicide may completely consume relatively shallow junctions, penetrating into the substrate underneath the junctions, a phenomenon known as "junction spiking". Consequently, the junctions may exhibit large current leakage or become electrically shorted. Therefore, precautions must be taken to prevent excessive consumption, and hence junction spiking, of the shallow junctions during contact formation.

A gate conductor made from a low-resistance metal would alleviate many of the problems with polysilicon gate conductors discussed above. Unfortunately, low-resistance metals such as aluminum are not able to withstand the high-temperature processing needed, for example, to anneal the as-implanted source and drain regions employed within a standard self-aligned process. It would therefore be desirable to develop a method of forming self-aligned gates using low-resistance metals or metal alloys. The desired method should further provide low-resistance source and drain regions, and low-resistance contacts to source, drain and gate regions so that series and contact resistances associated with the resulting transistor are reduced. In addition, these low-resistance source and drain regions should have small junction depths, so that short-channel effects such as punchthrough and $V_T$ reduction are minimized.

SUMMARY OF THE INVENTION

The problems outlined above are in large part addressed by a transistor having a source and drain formed from metal, and a method for fabricating this transistor. The transistor gate may also be formed from metal, or from other materials such as polysilicon. To fabricate the transistor, a protective dielectric layer is formed upon a semiconductor substrate, and source/drain trenches are formed in the protective dielectric layer by patterning and etching. These trenches, in which the final source and drain are subsequently formed, are filled with a sacrificial dielectric material. This sacrificial material is formed from a different dielectric than that used for the protective dielectric layer, in order to allow etch selectivity between the sacrificial dielectric and the protective dielectric layer.

After formation of the sacrificial dielectrics, the protective dielectric layer is removed to allow doping of the semiconductor substrate. This doping may include well, punchthrough, and/or threshold adjust implants. Dielectric spacers are subsequently formed on sidewalls of the sacrificial dielectrics. The spacers are formed from a different dielectric than that used for the sacrificial dielectrics. A gate dielectric is subsequently formed upon the semiconductor substrate, and the region above the gate dielectric and between the exposed lateral surfaces of the dielectric spacers is filled with a conductive material to form a gate conductor. Because no further high-temperature processing is believed to be needed, the gate conductor may be formed from a low-resistance metal such as copper or aluminum. Alternatively, a different material such as polysilicon may be used. If the gate conductor is formed from polysilicon, the polysilicon is doped either during deposition or by a subsequent impurity introduction. If an impurity introduction is performed using ion implantation, a subsequent anneal is carried out.

Subsequent to gate conductor formation (i.e., deposition, implant, and/or anneal), the sacrificial dielectrics are removed to form trenches bounded by upper surfaces of the semiconductor substrate and substantially vertical sidewalls of the dielectric spacers. These trenches are filled with metal to form permanent, low-resistance metal source/drain regions that are laterally displaced from the gate conductor by respective spacers.

The sidewall spacers formed adjacent to the sacrificial dielectrics may serve to define the dimensions of the permanent source/drain structures formed after the sacrificial dielectrics are removed. In this manner, the permanent source/drain structures may be self-aligned to the gate conductors. The only masking steps believed to be needed for the process recited herein are the mask which defines the openings for the source/drain trenches and a mask which may be used to define device isolation regions in the semiconductor substrate. This small number of masking steps allows extremely small devices to be fabricated, because fewer alignment tolerances need to be included in feature dimensions. Because the permanent source/drain regions are formed after any high-temperature processing needed for channel doping, gate dielectric formation, and/or gate conductor doping, they may be formed from a low-temperature material such as aluminum or copper. Copper source/drain regions may be particularly advantageous because of the low resistance of copper, and because such source/drain regions may be easily integrable with low-resistance copper interconnect technologies.

The low-resistance source/drain regions recited herein are formed using deposition and planarization steps, and may be formed using temperatures of less than about 500° C. High-temperature processing is therefore believed to be not necessary following formation of the transistor gate conductor. The gate conductor may therefore also be formed from a low-resistance metal such as aluminum or copper. Source, drain and gate regions formed from such a low-resistance metal are believed to exhibit substantially lower series and contact resistances than conventional silicon or polysilicon source, drain and gate regions. This improvement is believed to result from a metal resistivity which may be as much as $10^6$ times smaller than that of doped silicon or polysilicon. The lowered series and contact resistances believed to be exhibited by the transistor formed by the method recited herein may result in reduced RC time constants and faster device and circuit operation. The fabrication of the source and drain regions upon the semiconductor substrate is believed to have the effect of providing extremely shallow source/drain penetration into the substrate. This is believed to result in minimal encroachment of source/drain depletion regions into the channel of the transistor, minimizing short-channel effects such as threshold voltage reduction and punchthrough.

In addition to the method described above, a self-aligned transistor having metal source/drain regions is contemplated herein. A pair of source/drain regions, preferably formed from a low-resistance metal, are arranged upon the upper surface of a semiconductor substrate. The transistor channel is arranged within the semiconductor substrate, laterally between the lower extents of the source/drain regions. Dielectric spacers are formed upon the semiconductor substrate laterally adjacent sidewalls of the source/drain regions. A gate dielectric and gate conductor are formed upon the semiconductor substrate laterally adjacent and between the sidewall spacers, such that the upper surface of the gate conductor is level with the upper surfaces of the source/drain regions. The gate conductor may be formed from a metal, or from a different material such as polysilicon. A pair of dielectric isolation regions may be arranged within the semiconductor substrate, one on each side of the pair of source/drain regions

BRIEF DESCRIPTION OF THE DRAWINGS

Other objects and advantages of the invention will become apparent upon reading the following detailed description and upon reference to the accompanying drawings in which.

Figure 1:
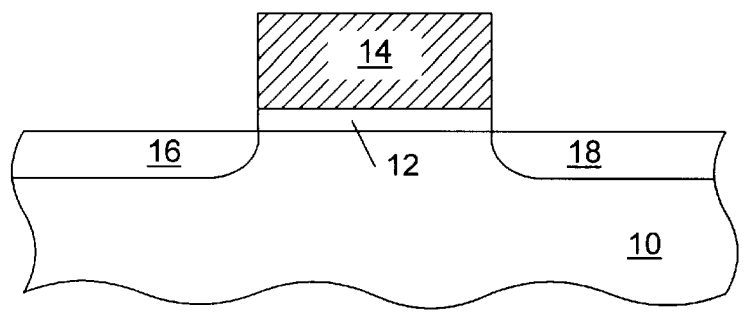
FIG. 1 is a partial cross-sectional view of a semiconductor topography including a self-aligned transistor formed using a conventional process.
Figure 2:
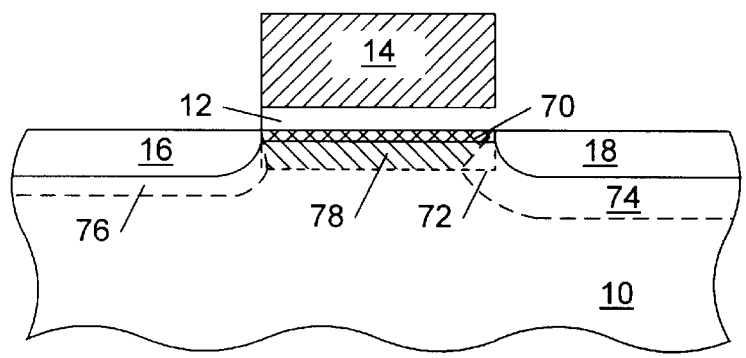
FIG. 2 is a partial cross-sectional view of the transistor of FIG. 1, including depletion region and inversion layer boundaries.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 3:
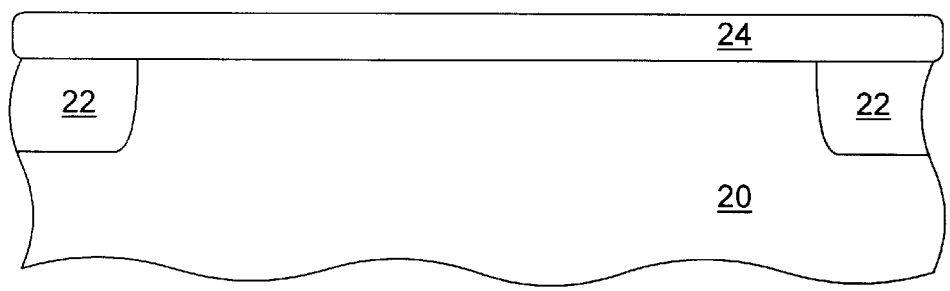
FIG. 3 is a partial cross-sectional view of a semiconductor topography including a protective dielectric layer formed over a semiconductor substrate.

Turning to the drawings, FIG. 3 illustrates a partial cross-section of a semiconductor topography including protective dielectric layer 24 formed on semiconductor substrate 20, according to an embodiment of the method recited herein. Isolation regions 22 may be formed within semiconductor substrate 20 to isolate the subsequently-formed transistor from adjacent transistors. Semiconductor substrate 20 is preferably monocrystalline silicon and is doped either n-type or p-type. Substrate 20 may, for example, be an epitaxial silicon layer grown on a monocrystalline silicon substrate, or an n-type or p-type well region formed in a monocrystalline silicon substrate. Dielectric isolation regions 22 may be formed by various methods prior to formation of protective dielectric 24. One such method is the formation of trenches which are subsequently filled with a deposited dielectric, while another method which may be used is local oxidation of the substrate, using silicon nitride to mask the active regions. Alternatively, similar dielectric-filled isolation trenches may be formed at later points in the method recited herein, even after transistor formation is completed.

Protective dielectric layer 24 is preferably deposited by chemical vapor deposition (CVD). Suitable dielectrics for protective dielectric layer 24 include silicon dioxide ("oxide"), silicon nitride ("nitride"), and silicon oxynitride ("oxynitride"). For the purposes of this application, "oxynitride" refers to dielectrics formed from silicon, oxygen, and nitrogen, and includes, for example, nitrided oxides. Ways in which an oxynitride may be formed include deposition using precursors containing silicon, oxygen and nitrogen, or annealing of an oxide in a nitrogen-bearing ambient. Suitable deposition methods for protective dielectric layer 24 may include low-pressure CVD (LPCVD), plasma-enhanced CVD (PECVD), and atmospheric-pressure CVD (APCVD). In embodiments for which dielectric layer 24 is formed from nitride, a thin pad oxide may be grown or deposited between dielectric layer 24 and substrate 20. Alternatively, protective dielectric layer 24 may be grown by heating substrate 20 to a temperature greater than about 700° C. in an oxidizing (to form, e.g., oxide or oxynitride) and/or nitrogen-bearing (to form, e.g., nitride or oxynitride) ambient. Protective dielectric layer 24 preferably has a thickness between about 1000 angstroms and about 2000 angstroms, but other thicknesses may also be suitable.

Figure 4:
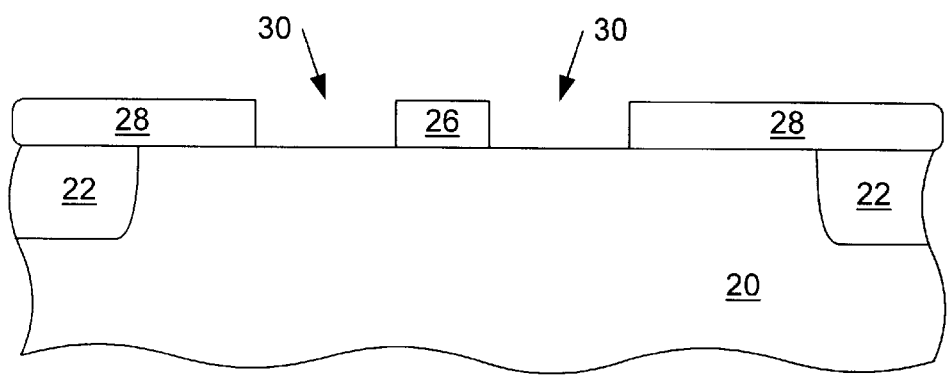
FIG. 4 is a partial cross-sectional view of the semiconductor topography wherein source/drain trenches are formed through the protective dielectric layer, subsequent to the dielectric layer formation of FIG. 3.

Source/drain trenches 30 are subsequently formed in protective dielectric layer 24, as shown in FIG. 4. Trenches 30 may be formed by depositing a layer of photoresist upon protective dielectric layer 24, and exposing the photoresist through a mask. The photoresist is subsequently developed, so that openings are formed exposing portions of the upper surface of protective dielectric layer 24. An anisotropic etching technique may then be used to etch away the exposed portions of dielectric layer 24, and the photoresist may be subsequently removed. Source/drain trenches 30 divide protective dielectric layer 24, shown in FIG. 3, into channel protective dielectric 26 and external protective dielectrics 28, as shown in FIG. 4.

Figure 5:
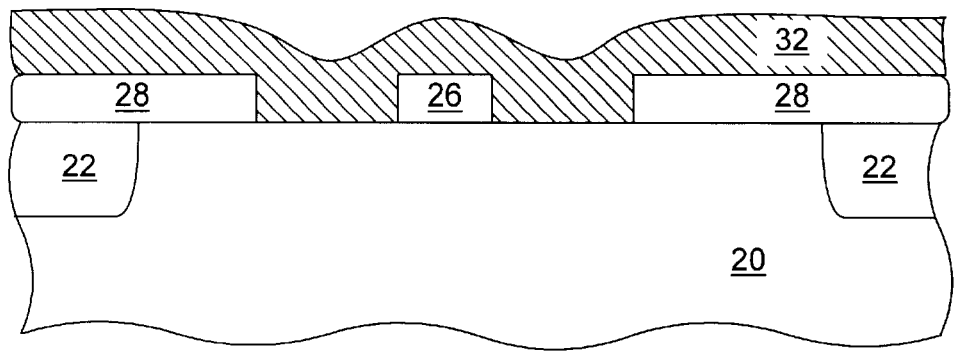
FIG. 5 is a partial cross-sectional view of the semiconductor topography wherein a conformal dielectric layer is deposited to fill the source/drain trenches, subsequent to the trench formation of FIG. 4.

Conformal dielectric layer 32 is subsequently deposited over semiconductor substrate 20 such that source/drain trenches 30 are filled, as shown in FIG. 5. Dielectric layer 32 is formed from a different dielectric than that used to form protective dielectrics 26 and 28, so that the sacrificial dielectrics subsequently formed from dielectric layer 32 may exhibit etch selectivity with respect to protective dielectrics 26 and 28. For example, if dielectrics 26 and 28 are formed from oxide, dielectric layer 32 may be nitride or oxynitride. Dielectric layer 32 is preferably deposited using a CVD technique. For example, if dielectric layer 32 is formed from oxide (dielectrics 26 and 28 would be formed from a different dielectric, such as nitride or oxynitride, in this case), decomposition of tetraethyl orthosilicate (TEOS) may be performed in an LPCVD reactor at a substrate temperature in the range from about 400° C. to about 800° C. to produce a very conformal film. Alternatively, other techniques such as CVD using a silane source may be used.

Figure 6:
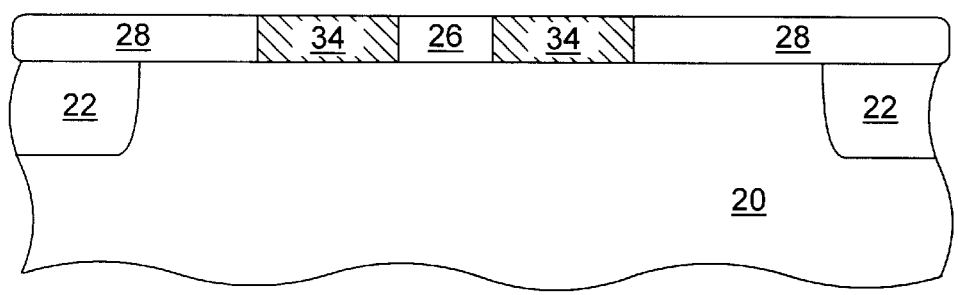
FIG. 6 is a partial cross-sectional view of the semiconductor topography wherein portions of the dielectric layer external to the trenches are removed to form sacrificial dielectrics, subsequent to the dielectric deposition of FIG. 5.
Figure 7:
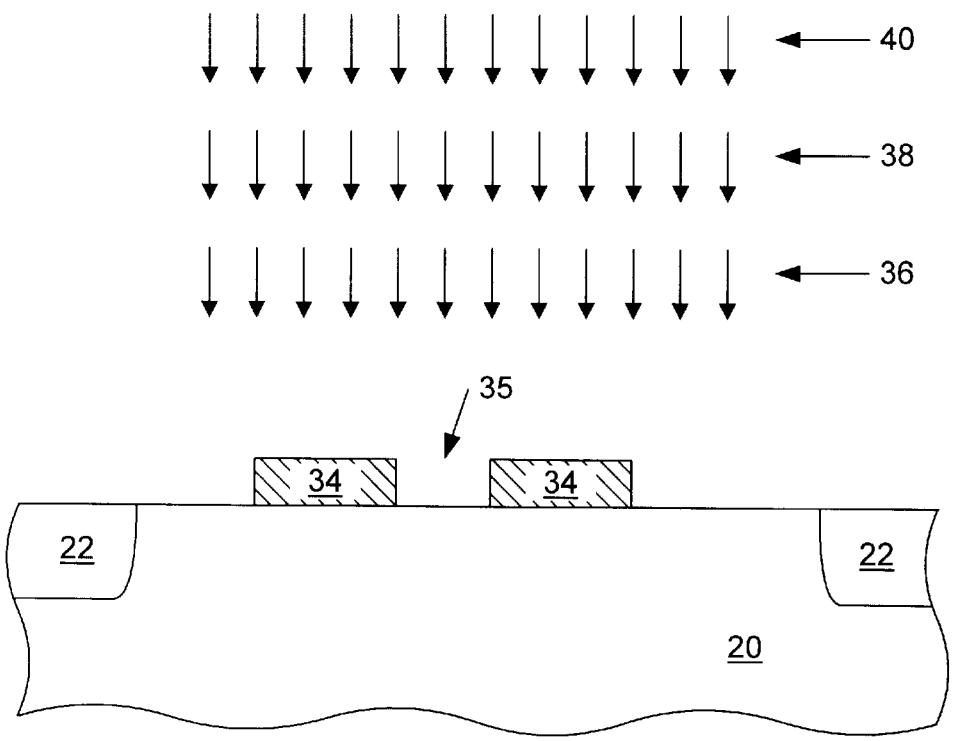
FIG. 7 is a partial cross-sectional view of the semiconductor topography wherein the protective dielectric layer is removed and impurities are introduced into the semiconductor substrate, subsequent to the dielectric portion removal of FIG. 6.

Portions of dielectric layer 32 which extend above the upper surfaces of protective dielectrics 26 and 28 are subsequently removed, as shown in FIG. 6. The removal process is preferably performed using chemical-mechanical polishing (CMP), although other techniques, such as reflow and etchback, may also be suitable. The remaining portions of dielectric layer 32 form sacrificial dielectrics 34, which have upper surfaces at the same level as the upper surfaces of protective dielectrics 26 and 28. Protective dielectrics 26 and 28 are subsequently removed, as shown in FIG. 7. This removal is preferably done using a dry etching process, but other etches may also be suitable. For example, in an embodiment for which protective dielectrics 26 and 28 are oxide and sacrificial dielectrics 32 are nitride or oxynitride, protective dielectrics 26 and 28 may be removed by a wet etch in hydrofluoric acid buffered with ammonium fluoride, which is selective to oxide over nitride so that sacrificial dielectrics 34 are not removed. Removal of protective dielectric 26 forms gate trench 35, which is bounded by the upper surface of substrate 20 and sidewalls of sacrificial dielectrics 34.

Channel impurities are subsequently introduced into semiconductor substrate 20 using impurity introduction processes such as processes 36, 38 and 40 of FIG. 7, which are preferably ion implantation processes. By analogy with conventional transistor fabrication processes, impurity introduction 36 may represent a well implant, introduction 38 may represent a punchthrough prevention implant, and introduction 40 may represent a threshold adjust implant. Because sacrificial dielectrics 34, which are subsequently replaced with source/drain regions, are formed upon, rather than within, semiconductor substrate 20, the penetration of the transistor source/drain regions into the substrate is believed to be extremely small. Because the transistor channel is formed within the semiconductor substrate, the encroachment of source/drain depletion regions into the channel is believed to be minimal. This reduced penetration of source/drain depletion regions into the channel is believed to reduce the severity of short-channel effects such as punchthrough. It is therefore contemplated that a separate punchthrough prevention impurity introduction, such as introduction process 38 of FIG. 7, may be unnecessary. For an n-channel transistor, well and punchthrough impurities are p-type, while for a p-channel transistor these impurities are n-type. Threshold adjust impurities, which may be introduced using impurity introduction 40, are typically p-type in n-channel transistors. In embodiments for which channel dopants are introduced by ion implantation, a subsequent anneal is performed to activate the implanted impurities and repair any damage to semiconductor substrate 20.

Figure 8:
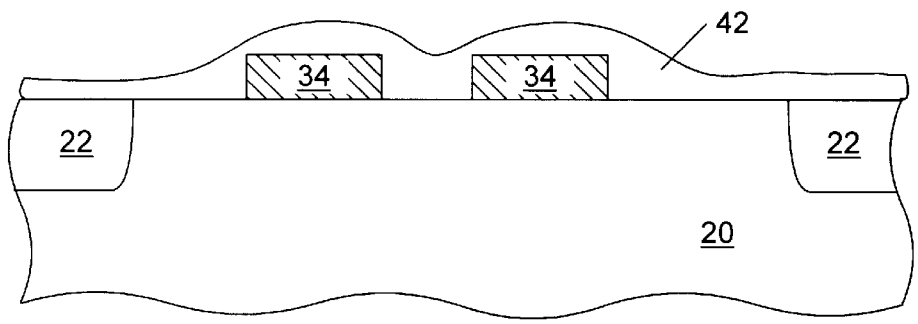
FIG. 8 is a partial cross-sectional view of the semiconductor topography wherein a conformal dielectric layer is deposited over the semiconductor substrate and sacrificial dielectrics, subsequent to the impurity introduction of FIG. 7.
Figure 9:
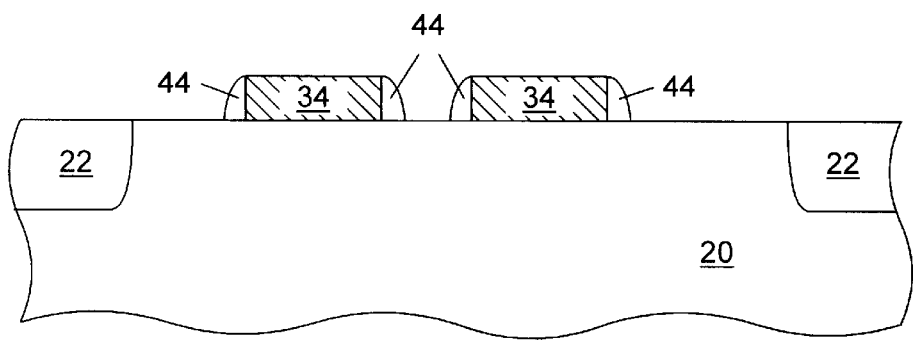
FIG. 9 is a partial cross-sectional view of the semiconductor topography wherein portions of the dielectric layer are removed to form spacers, subsequent to the dielectric deposition of FIG. 8.

Conformal dielectric layer 42 is subsequently deposited over semiconductor substrate 20 and sacrificial dielectrics 34, as shown in FIG. 8. Dielectric layer 42 is formed from a different dielectric than that used to form sacrificial dielectrics 34, so that sacrificial dielectrics 34 may be subsequently removed without damage to the spacers which are formed from dielectric layer 42. Suitable dielectrics for dielectric layer 42 may include oxide, nitride and oxynitride. Other dielectrics which may be suitable include low-permittivity ("low-K") dielectrics such as fluorine-doped oxide. Dielectrics having a dielectric constant lower than about 3.5 are typically considered to be low-K dielectrics, while the dielectric constant of undoped oxide is about 4. In embodiments for which dielectric layer 42 is formed from nitride, a thin pad oxide may be deposited or grown prior to deposition of dielectric layer 42. Portions of dielectric layer 42 are subsequently removed, preferably using an anisotropic etch process, to form spacers 44 on sidewalls of sacrificial dielectrics 34, as shown in FIG. 9. Spacers 44 provide electrical isolation between the transistor gate subsequently formed between sacrificial dielectrics 34 and the transistor source/drain regions subsequently formed in place of sacrificial dielectrics 34. Use of a low-K dielectric to form spacers 44 may be advantageous in reducing capacitance between these gate and source/drain regions. The lateral width of spacers 44 may be as small as about 150 angstroms. In a preferred embodiment, spacers 44 have a lateral width between about 150 angstroms and about 300 angstroms. Wider spacers may be used, but spacers narrower than about 150 angstroms may result in excessive capacitance between the gate and source/drain regions of the subsequently-completed transistor.

Figure 10:
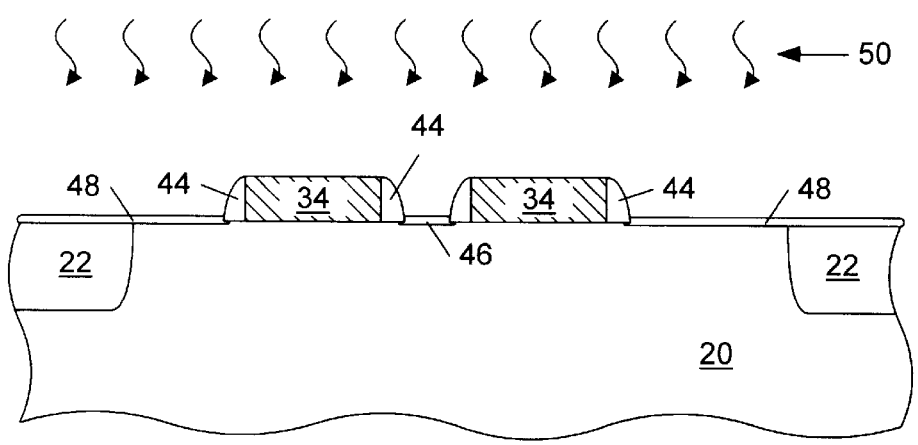
FIG. 10 is a partial cross-sectional view of the semiconductor topography wherein a gate dielectric is formed upon the semiconductor substrate, subsequent to the spacer formation of FIG. 9.
Figure 11:
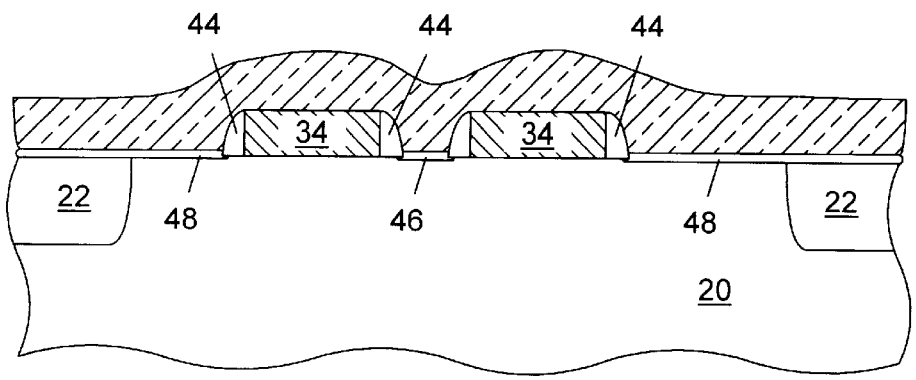
FIG. 11 is a partial cross-sectional view of the semiconductor topography wherein a conductive material is deposited over the gate dielectric, spacers and sacrificial dielectrics, subsequent to the gate dielectric formation of FIG. 10.

Gate dielectric 46 is subsequently formed on the exposed upper surface of semiconductor substrate 20, as shown in FIG. 10. External dielectrics 48 are simultaneously formed on either side of the pair of sacrificial dielectrics 34. Dielectrics 46 and 48 may be grown using thermal process 50, in which substrate 20 is heated to a temperature of at least 700° C. in an oxidizing and/or nitrogen-bearing ambient. Alternatively, dielectrics 46 and 48 may be deposited using a CVD technique. Dielectrics which may be used for dielectrics 46 and 48 include oxide, nitride, oxynitride and/or combinations of these. Turning now to FIG. 11, conductive layer 52 is deposited over dielectrics 46 and 48, spacers 44, and sacrificial dielectrics 34, such that gate trench 35, shown in FIG. 7, is filled. Conductive layer 52 is preferably formed using a low-resistivity metal such as copper or aluminum, or a metal alloy which demonstrates high conductivity. Copper may be particularly advantageous because of its extremely low resistivity, and its compatibility with copper interconnect processes. Because subsequent source and drain region formation employs low-temperature deposition and planarization techniques, conductive layer 52 is believed not to undergo high temperatures during subsequent processing. It is therefore believed to be not necessary for conductive layer 52 to be capable of withstanding high temperatures. The substrate temperature used for deposition of conductive layer 52 is typically between about 200° C. and 300° C.

In an embodiment for which conductive layer 52 is formed from copper, gate dielectric 46 is preferably silicon nitride, because silicon nitride is believed to be more effective than silicon dioxide in blocking diffusion of copper atoms from their deposited positions. Deposition of copper or other metals for conductive layer 52 may include deposition of an adhesion promoting layer and/or deposition of a diffusion barrier layer. Titanium nitride, for example, may be a suitable material for both adhesion promotion and diffusion blocking. Titanium nitride may be deposited by methods including evaporation or sputtering of titanium in a nitrogen ambient, sputtering of titanium nitride, and thermal nitridation of sputtered titanium. Copper deposition may also include formation of a thin seed layer of copper by physical vapor deposition (PVD) techniques such as evaporation or sputtering, or by CVD. Deposition of thicker copper layers may include CVD, PVD and plating techniques.

Figure 12:
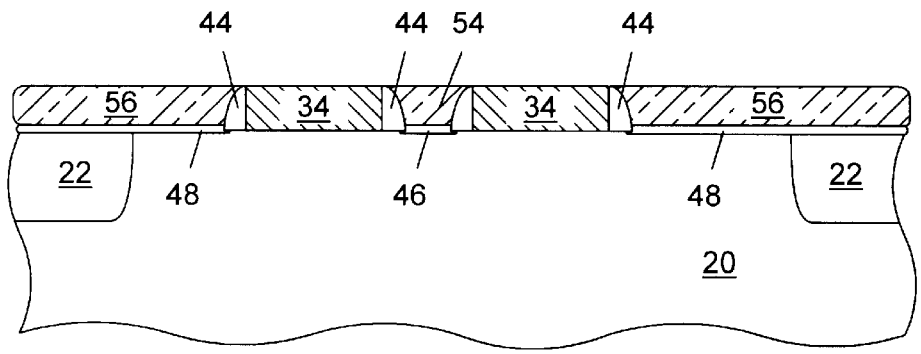
FIG. 12 is a partial cross-sectional view of the semiconductor topography wherein portions of the conductive material extending above the upper surface of the sacrificial dielectrics are removed such that a gate conductor is formed, subsequent to the conductive material deposition of FIG. 11.

Portions of conductive layer 52 which extend above the upper surfaces of sacrificial dielectrics 34 are subsequently removed, as shown in FIG. 12. The removal is preferably done using CMP, and the remaining portions of conductive layer 52 form gate conductor 54 and external conductors 56. The CMP process of FIG. 12 may be continued until the upper surfaces of gate conductor 54 and sacrificial dielectrics 34 are at a slightly lower elevation than the elevation of the upper surfaces of sacrificial dielectrics 34 before the CMP process of FIG. 12. In other words, the surface which includes upper surfaces of dielectrics 34, spacers 44 and gate conductor 54 may be slightly "overpolished". In this way, the widths of the upper surfaces of spacers 44 are slightly increased, insuring adequate isolation between gate conductor 54 and the source/drain regions subsequently formed in place of sacrificial dielectrics 34. A similar overpolishing technique may be employed in the subsequent CMP process of FIG. 15 below.

Figure 13:
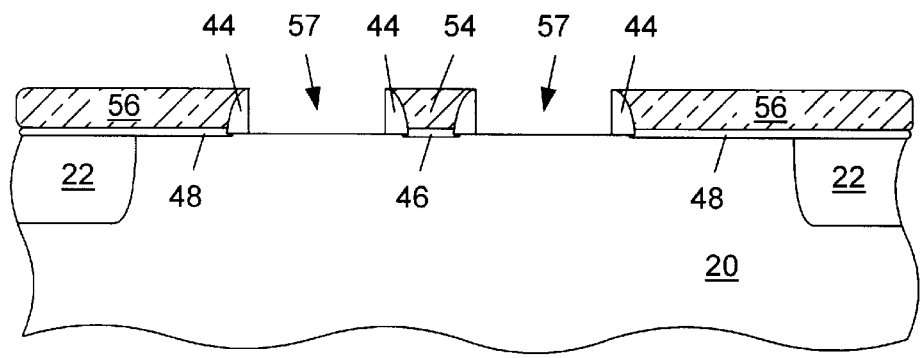
FIG. 13 is a partial cross-sectional view of the semiconductor topography wherein the sacrificial dielectrics are removed from the source/drain trenches, subsequent to the gate conductor formation of FIG. 12.
Figure 14:
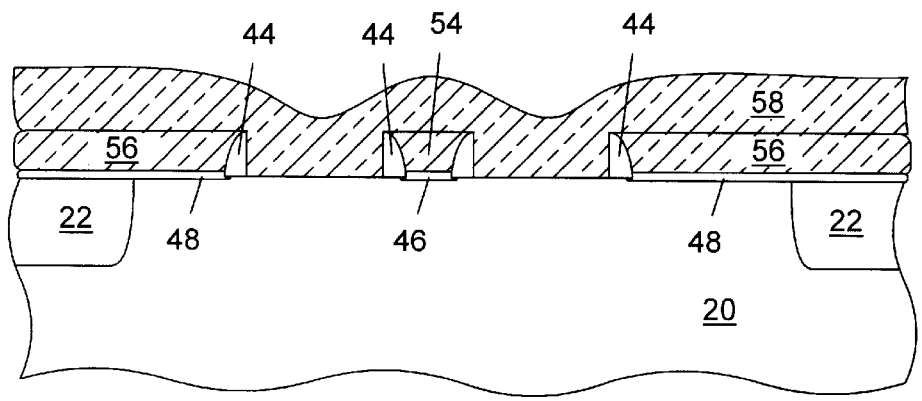
FIG. 14 is a partial cross-sectional view of the semiconductor topography wherein a conductive layer is deposited to fill the source/drain trenches, subsequent to the sacrificial dielectric removal of FIG. 13.

Sacrificial dielectrics 34 are subsequently removed, as shown in FIG. 13. As in the case of the protective dielectric removal of FIG. 7, this removal is preferably done using a dry etching process, but other etches may also be suitable. Removal of dielectrics 34 forms source/drain trenches 57, which are similar to source/drain trenches 30 of FIG. 4. Source/drain trenches 57 are bounded by the upper surface of semiconductor substrate 20 and by sidewalls of spacers 44. Conductive layer 58 is subsequently deposited such that trenches 57 are filled, as shown in FIG. 14. As in the case of conductive layer 52 of FIG. 11, conductive material 58 is preferably a low-resistivity metal such as copper or aluminum, or a metal alloy which demonstrates high conductivity. The composition and deposition methods suitable for conductive material 58 are similar to those for conductive material 52. Conductive layers 52 and 58 may both include multiple metals, diffusion barriers, and/or adhesion promoting layers. In one embodiment, formation of conductive layer 58 may begin with deposition of thin layers of titanium and cobalt, followed by a layer of either titanium nitride or nickel. Copper may then be deposited to complete layer 58. A subsequent contact forming or alloying anneal may be used, but is not believed to be necessary. Even with such an anneal, the formation of conductive layer 58 is believed to involve no heating above about 500° C.

Figure 15:
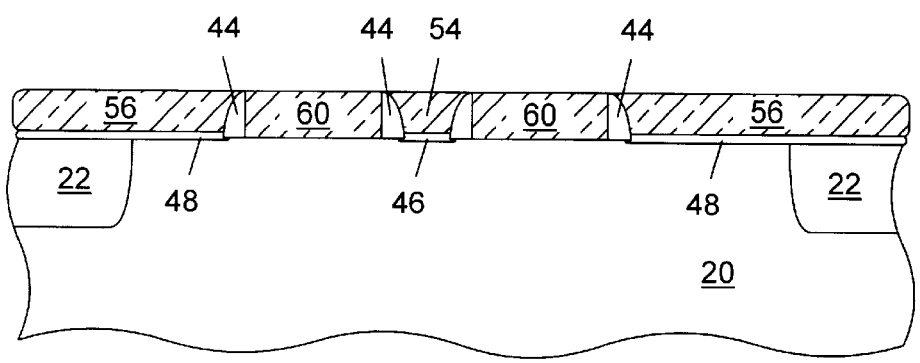
FIG. 15 is a partial cross-sectional view of the semiconductor topography wherein portions of the conductive layer external to the source/drain trenches are removed so that source/drain regions are formed, subsequent to the conductive layer deposition of FIG. 14.

Portions of conductive layer 58 external to source/drain trenches 57 are subsequently removed, as shown in FIG. 15. The removal is preferably done using CMP, and the remaining portions of conductive layer 57 form source/drain regions 60. As noted for the CMP process of FIG. 12 above, the CMP process of FIG. 15 may be continued until the upper surfaces of gate conductor 54 and source/drain regions 60 are at a slightly lower elevation than the elevation of the upper surface of gate conductor 54 before the CMP process of FIG. 15. In this way, the widths of the upper surfaces of spacers 44 are slightly increased, insuring adequate isolation between gate conductor 54 and source/drain regions 60.

The transistor of FIG. 15 includes low-resistance metal source/drain and gate regions and is formed by a self-aligned process. The transistor channel is in semiconductor substrate 20, just below gate dielectric 46. The only masks required for the transistor formation are one for the source/drain trench formation of FIG. 4, and one for formation of isolation regions 22. The method therefore requires minimal tolerances for mask alignment error, and small transistor feature sizes may be achieved. The use of a low-resistance metal source, drain and gate may greatly reduce contact and series resistances in the transistor, so that low RC time constants and high-speed operation may be obtained. Furthermore, the formation of source/drain regions 60 above rather than within substrate 20 is believed to reduce penetration of source/drain depletion regions into the transistor channel. The transistor of FIG. 15 is therefore believed to exhibit less severe short-channel effects, such as threshold voltage reduction and punchthrough, than a conventional transistor having comparable channel length and channel doping. Excessive parasitic capacitance between gate conductor 54 and source/drain regions 60 may be minimized by, for example, using spacers having a lateral width greater than about 150 angstroms and by forming spacers such as spacers 44 from a low-K dielectric. Transistors fabricated using the process recited herein may be particularly suitable for low-voltage applications using voltages less than or equal to about 1.5 volts. Further dielectric deposition, metal deposition, and patterning may subsequently be performed in order to form contacts and interconnects linking the transistor with other parts of an integrated circuit.

Figure 16:
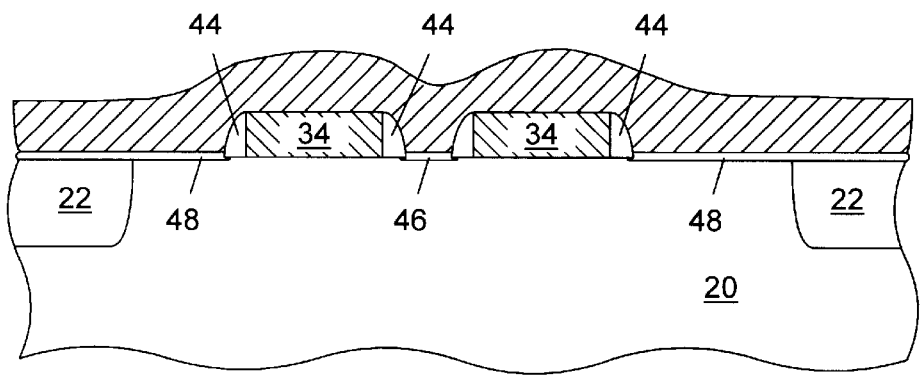
FIG. 16 is a partial cross-sectional view of the semiconductor topography according to an alternative embodiment, wherein a polysilicon layer is deposited over the gate dielectric, spacers and sacrificial dielectrics, subsequent to the gate dielectric formation of FIG. 10.
Figure 17:
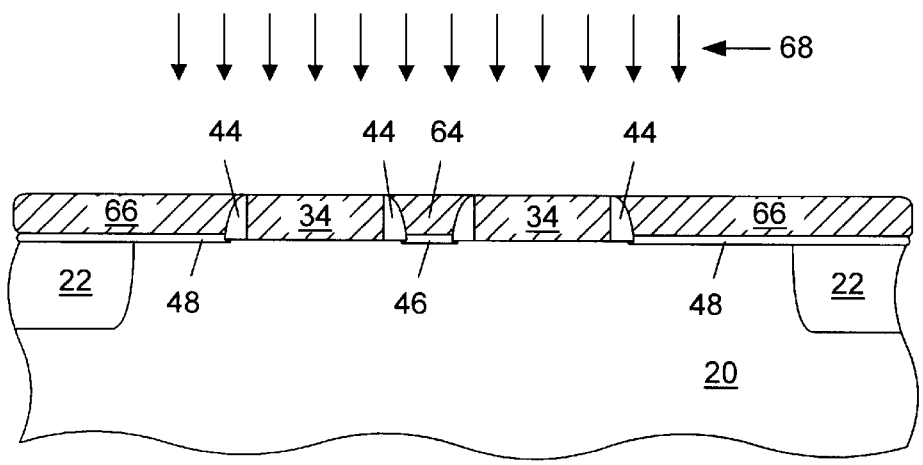
FIG. 17 is a partial cross-sectional view of the semiconductor topography, wherein portions of the polysilicon layer extending above the upper surface of the sacrificial dielectrics are removed and dopant impurities are introduced, subsequent to the polysilicon deposition of FIG. 16.
Figure 18:
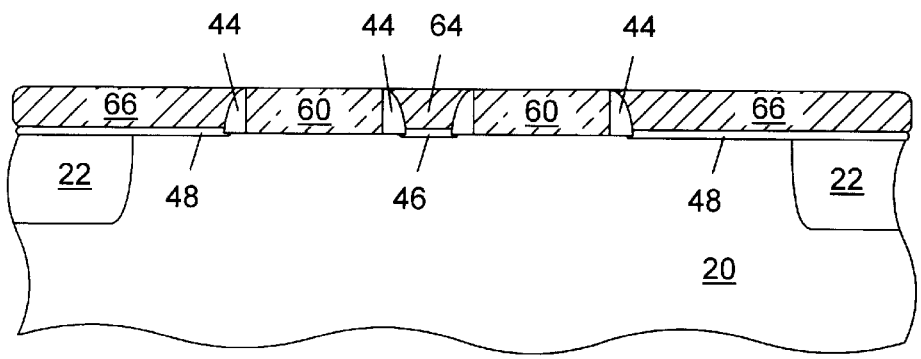
FIG. 18 is a partial cross-sectional view of the semiconductor, wherein metal source/drain regions are formed, subsequent to the impurity introduction of FIG. 17.

An alternate embodiment of the method recited herein is illustrated in FIGS. 16–18. Polysilicon layer 62 may be deposited over dielectrics 46 and 48, spacers 44, and sacrificial dielectrics 34, as shown in FIG. 16. Polysilicon layer 62 of this embodiment is used instead of conductive layer 52 of FIG. 11, which is preferably formed from metal. Use of a polysilicon gate may be advantageous for reasons which may include avoiding a work function difference between the gate conductor and channel of a transistor, or compatibility with conventional device fabrication. Polysilicon layer 62 is preferably deposited by pyrolysis, or thermal decomposition, of silane in an LPCVD reactor at a temperature between about 550° C. and about 650° C. Other types of CVD which may also be suitable for formation of polysilicon layer 62 include PECVD and APCVD. If a deposition temperature of less than 580° C. is used, an amorphous silicon layer may be formed. A polycrystalline layer may be formed from such an amorphous layer by heating it to temperatures above about 400° C.

Portions of polysilicon layer 62 extending above the upper surfaces of sacrificial dielectrics 34 are subsequently removed, so that polysilicon gate conductor 64 is formed, as shown in FIG. 17. Gate conductor 64 may be doped using impurity introduction 68 to lower its resistivity. Impurity introduction 68 is preferably an ion implantation process, and the implantation energy and dose are adjusted so that gate conductor 64 is doped as heavily and uniformly as possible, while avoiding diffusion of dopants across gate dielectric 46 into the transistor channel. In embodiments for which gate conductor 64 is doped by ion implantation, a subsequent anneal is performed to activate implanted dopant impurities and repair damage to polysilicon gate conductor 64. Alternatively, gate conductor 64 may be doped during deposition of polysilicon layer 62. Continued processing of the semiconductor topography of FIG. 17 in the manner of FIGS. 13–15 results in the polysilicon-gate transistor of FIG. 18. Remaining portions 66 of polysilicon layer 62 are separated from source/drain regions 60 by spacers 44. The transistor of FIG. 18 is similar to that of FIG. 15 except that the gate is formed from polysilicon rather than from metal.

It will be appreciated to those skilled in the art having the benefit of this disclosure that this invention is believed to provide a method for forming a self-aligned transistor having low-resistance metal source/drain regions by using sacrificial dielectric source/drain structures. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising:
   a pair of source/drain regions comprising a conductive material arranged upon a monocrystalline semiconductor substrate;
   a channel arranged within the monocrystalline semiconductor substrate, laterally between the source/drain regions;
   a gate conductor comprising a conductive material aligned with said channel and separated from it by a gate dielectric, wherein an entire upper surface of said gate conductor is at substantially the same elevation level as upper surface of the source/drain regions, and wherein a lower extent of the source/drain regions is at an elevation level higher than that of a lower extent of the gate dielectric.

2. The transistor as recited in claim 1, wherein a lower extent of the source/drain regions is at an elevation level higher than that of the channel.

3. The transistor as recited in claim 1, further comprising dielectric spacers arranged upon the semiconductor substrate and laterally adjacent facing sidewalls of the source/drain regions, such that one of the dielectric spacers is interposed between each of the source/drain regions and the gate conductor.

4. The transistor as recited in claim 1, wherein said conductive material comprises a metal.

5. The transistor as recited in claim 4, wherein said metal comprises copper.

6. The transistor as recited in claim 1, wherein a thickness of said source/drain regions is between about 1000 angstroms and about 2000 angstroms.

7. The transistor as recited in claim 1, wherein said gate conductor comprises metal.

8. The transistor as recited in claim 1, wherein said metal comprises copper.

9. The transistor as recited in claim 4, wherein said gate conductor comprises doped polysilicon.

10. The transistor as recited in claim 1, further comprising a pair of dielectric isolation regions arranged within the semiconductor substrate, wherein both of said source/drain regions are laterally disposed between the dielectric isolation regions.

11. The transistor as recited in claim 1, wherein said source/drain regions are substantially free of dopant impurities of opposite type to that of the semiconductor substrate.

12. A transistor, comprising:
   a pair of source/drain regions comprising a conductive material arranged upon a monocrystalline semiconductor substrate;
   a channel arranged within the monocrystalline semiconductor substrate, laterally between the source/drain regions; and a gate conductor configured within a trench arranged between the source/drain regions, and separated from the channel by a gate dielectric, wherein the gate conductor substantially fills the trench, and wherein an upper surface of the gate conductor is at substantially the same elevation level as upper surfaces of the source/drain regions, and wherein a lower extent of the source/drain region is at an elevation level higher than that of a lower extent of the gate dielectric.

13. The transistor as recited in claim 12, further comprising dielectric spacers arranged laterally adjacent facing sidewalls of the source/drain regions, such that the trench is laterally bounded by said dielectric spacers.

14. The transistor as recited in claim 12, wherein said conductive material comprises a metal.

15. The transistor as recited in claim 14, wherein said metal comprises copper.

16. The transistor as recited in claim 12, wherein said source/drain regions are substantially free of dopant impurities of opposite type to that of the semiconductor substrate.

* * * * *

UNITED STATES PATENT AND TRADEMARK OFFICE
CERTIFICATE OF CORRECTION

PATENT NO. : 6,057,583
DATED : May 2, 2000
INVENTOR(S) : Gardner et al.

It is certified that error appears in the above-identified patent and that said Letters Patent is hereby corrected as shown below:

In the Claims:

Claim 1, col. 12, line 27, please delete "surface" and substitute --surfaces--.

Signed and Sealed this

Twenty-seventh Day of February, 2001

Attest:

NICHOLAS P. GODICI

Attesting Officer    Acting Director of the United States Patent and Trademark Office